United States Patent [19]
Ando et al.

[11] Patent Number: 5,672,984
[45] Date of Patent: Sep. 30, 1997

[54] PROGRAMMABLE LOGIC ARRAY HAVING POWER-SAVING BANKS

[75] Inventors: Kazumasa Ando, Kawasaki; Syoji Horie, Yokohama, both of Japan

[73] Assignee: Kabushiki Kaisha Toshiba, Kawasaki, Japan

[21] Appl. No.: 654,938

[22] Filed: May 29, 1996

Related U.S. Application Data

[63] Continuation of Ser. No. 312,799, Sep. 27, 1994, abandoned.

[30] Foreign Application Priority Data

Sep. 29, 1993 [JP] Japan .................................. 5-242888

[51] Int. Cl.⁶ .............................................. H03K 19/177
[52] U.S. Cl. .............................................. 326/39; 326/40
[58] Field of Search .......................... 395/375, 595; 340/825.83; 364/716; 326/39, 40, 44, 45

[56] References Cited

U.S. PATENT DOCUMENTS

| | | | |
|---|---|---|---|
| 3,891,972 | 6/1975 | Egan | 395/375 |
| 4,034,356 | 7/1977 | Howley et al. | 326/39 |
| 4,394,735 | 7/1983 | Satoh et al. | 395/375 |
| 4,906,870 | 3/1990 | Gongwer | 364/716 |
| 5,021,689 | 6/1991 | Pickett et al. | 326/38 |
| 5,033,017 | 7/1991 | Taniai et al. | 364/716 |
| 5,189,628 | 2/1993 | Olsen et al. | 326/38 |

FOREIGN PATENT DOCUMENTS

| | | |
|---|---|---|
| 0 337 676 | 10/1989 | European Pat. Off. . |
| 0 377 976 | 7/1990 | European Pat. Off. . |
| 0 428 300 | 5/1991 | European Pat. Off. . |
| 0 458 362 | 11/1991 | European Pat. Off. . |
| 5-122057 | 5/1993 | Japan . |

OTHER PUBLICATIONS

Hennessy et al.; "Computer Architecture, A Quantitative Approach"; ©1990 by Morgan Kaufmann Publishers, Inc.; pp. 204–206.

Mano, M. Morris, "Computer System Architecture" 3rd Edition; ©1993 by Prentice-Hall, Inc.; pp. 450–453.

"PLD For State-Machine Designs Features Low-Power Operation", Computer Design, Apr., 1991, p. 117.

*Primary Examiner*—Edward Westin
*Assistant Examiner*—Benjamin D. Driscoll
*Attorney, Agent, or Firm*—Finnegan, Henderson, Farabow, Garrett & Dunner, L.L.P.

[57] ABSTRACT

A programmable logic array comprises a PLA area having a plurality of banks wherein each of the bank has an array of a discharge typed logic circuit for decoding a micro-code, a command code is inputted to each bank every cycle for executing a predetermined command, and each bank outputs bank selection data for determining by which bank a command of a next cycle be decoded at the previous cycle, and a control circuit for selecting one bank for decoding the command code of the next cycle from the plurality of banks based on the bank selection data of each bank in the previous cycle, and for sending a command code to only the selected one bank to perform discharge of a discharge typed logic circuit, thereby stopping operations of other banks.

3 Claims, 6 Drawing Sheets

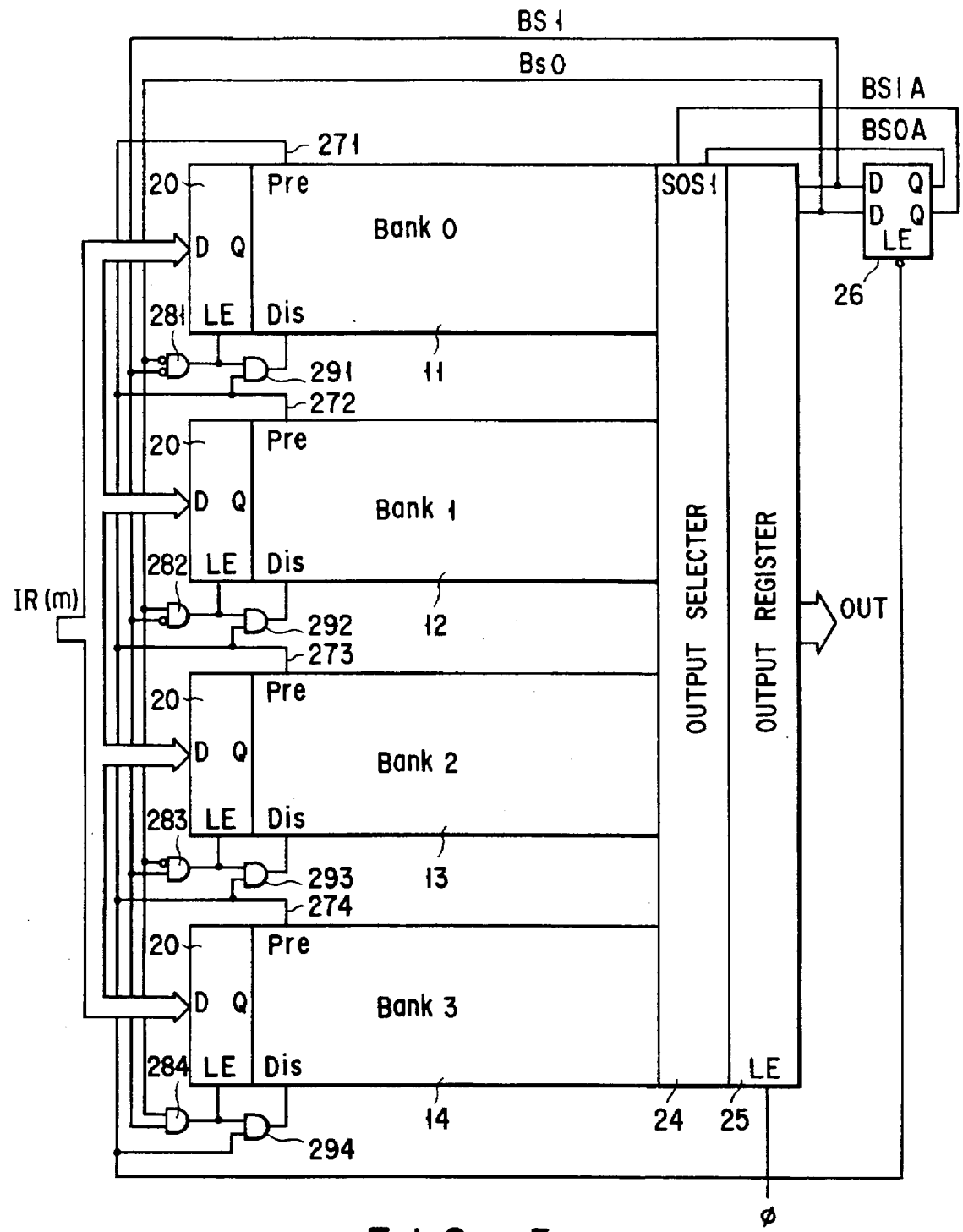
F I G. 5

PROGRAMMABLE LOGIC ARRAY HAVING POWER-SAVING BANKS

This application is a continuation of application Ser. No. 08/312,799 filed Sep. 27, 1994, now abandoned.

BACKGROUND OF THE INVENTION

1. Field of the Invention

The present invention relates to a programmable logic array (PLA) for decoding a micro code in a one-chip microcomputer, a microprocessor (MPU), and a microcontroller (MCU).

2. Description of the Related Art

In general, a PLA for micro code has an AND array section for an input of the micro code and an OR array section for an output of decode.

The AND array section is formed to be an AND typed or an OR typed. The AND typed AND array section is characterized in that the area of the section is small and the section is formed on a semiconductor chip. The OR typed AND array section is characterized in that the speed of an operation of the section is high.

FIG. 1 shows one example of a conventional PLA for micro-code.

In the PLA, the AND array section is formed to be AND typed.

Reference numeral 51 is an AND typed AND array section, 52: an OR array section, 53: an address input buffer circuit provided on an input side of the AND array section 51, 54: a clock input buffer circuit provided on an input side of the AND array section 51, and 55: an output latch circuit provided on an output side of the OR array section.

The buffer circuit 53 increases a PLA input signal IR<m>, and supplies the signal to the AND array section 51 as a command code. The buffer circuit 54 increases a precharge-discharge signal (Pre/Dis signal) and supplies the signal to the AND array section 51 and the OR array section 52.

The AND array section 51 comprises a plurality of NAND circuits arranged in a column direction X, and a plurality of inverter circuits 511, which inverts each of outputs of the plurality of the NAND circuits, and inputs these outputs to the OR array section 52.

Each NAND circuit comprises one P channel MOS transistor 512 for precharge wherein a source is connected to a power supply voltage (Vcc) node, one N channel MOS transistor 514 for discharge wherein a source is connected to a ground voltage (Vss) node, and a plurality of N channel MOS transistors 513 connected in series between a drain of the P channel MOS transistor 512 and a drain of the N channel MOS transistor 514.

The OR array section 52 comprises a plurality of NOR circuits arranged in a row direction Y, a word line extending in a row direction Y, and a decode output wire (bit line) extending in a column direction X.

Each NOR circuit comprises one P channel MOS transistor 521 for precharge wherein a source is connected to a power supply (Vcc) node and a plurality of N channel MOS transistors 522 wherein a drain is connected to a drain of the P channel MOS transistor 521 and a source is connected to a ground voltage (Vss) node.

FIG. 2 is a timing chart showing an operation of the micro-code PLA of FIG. 1.

First of all, when the Pre/Dis charge signal is set to a precharge mode ("0" level), the AND array section 51 and the OR array section 52 are precharged, respectively. If the PLA input signal IR<m> is inputted during the precharge mode, all inputs of one NAND circuit are set to "1" level in the AND array section 51.

Next, when the Pre/Dis charge signal is set to a discharge mode ("1" level), the N channel MOS transistor 514 of each NAND circuit is turned on. Therefore, an output signal of one NAND circuit in which all inputs are set to "1" level is set to "0" level, and the outputs of the other NAND circuits are set to "1" level.

The output signal of each NAND circuit is reversed by the inverter circuit 511, and inputted to the OR array section 52.

In the OR array section 52, the NOR circuit to which the voltage of "1" level is inputted outputs an output signal of "0" level. For example, in a case that a word line DECO is set to "0" level, a bit line Bit0 is set to "0" level.

The output latch circuit 55 latches the output of the OR array section 52 by complementary clock signals PHJ/PH, and outputs the signal as an output signal out of PLA.

FIG. 3 shows an example of a conventional microcode PLA.

In the PLA, the AND array section is formed to be OR typed.

Reference numeral 71 is an OR typed AND array section, 72: an OR array section, 53: an address input buffer circuit, 54: a clock input buffer circuit, and 55: an output latch circuit.

The AND array section 71 comprises a plurality of NOR circuits arranged in a column direction X, and a plurality of inverter circuits 711 for inputting an output signal of each of the NOR circuits to the OR array section 72.

Each NOR circuit comprises one P channel MOS transistor 712 for precharge wherein a source is connected to a power supply voltage (Vcc) node, one N channel MOS transistor 714 for discharge wherein a source is connected to a ground voltage (Vss) node, and one or more N channel MOS transistors 713 connected in parallel between a drain of the P channel MOS transistor 712 and a drain of the N channel MOS transistor 714.

In this case, one specific NOR circuit of the NOR circuits has two N channel MOS transistors 714 for discharge.

The OR array section 72 comprises a plurality of NOR circuits arranged in a row direction Y, a word line extending in a row direction Y, and a decode output wire (bit line) extending in a column direction X.

For example, each NOR circuit comprises one P channel MOS transistor 721 for precharge wherein a source is connected to a power supply voltage (Vcc) node, one N channel MOS transistor 723 for discharge wherein a source is connected to a ground voltage (Vss) node, and one or more N channel MOS transistors 722 connected in parallel between a drain of the P channel MOS transistor 721 and a drain of the N channel MOS transistor 723.

Moreover, in the OR array section 72, a delay circuit 73 is provided.

The delay circuit 73 delays the discharge operation of the N channel MOS transistor 723 for discharge of each NOR circuit by a predetermined time as compared with the discharge operation of the N channel MOS transistor 714 for discharge of the AND array section 71.

The delay circuit 73 comprises an inverter circuit 731 for inverting the output signal of one NOR circuit of the AND array section 71, an NAND circuit 732 to which the output signal of the inverter circuit 731 and the Pre/Dis signal are inputted, and an inverter circuit 733, which inverts the output signal of the NAND circuit 732, and inputs the signal to a gate of the N channel MOS transistor 723 for discharge of each NOR circuit.

FIG. 4 shows one example of an operation timing of the micro-code of FIG. 3.

First of all, when the Pre/Dis signal is set to a precharge mode ("0" level), precharging is performed in each of the AND array section 71 and the OR array section 72.

An input IR(m) is inputted from the outer section of PLA during the precharge. In the AND array section 71, all inputs of one NOR circuit are set to "0" level.

However, the output signals of all NOR circuits of the AND array section 71 are set to "1" level, and each of these output signals is inputted to the OR array section 72 through each inverter circuit 711.

The input signals of all NOR circuits of the OR array section 72 are set to "1" level. The inverter circuit 731 outputs an output signal of "0" level. The NAND circuit 732 receives the Pre/Dis signal of "0" level and the output of the inverter circuit 731 of "0" level, and outputs an output signal of "1" level.

The inverter circuit 733 supplies a Dis-OR signal of "0" level to a gate of the N channel MOS transistor 723 for discharge of each NOR circuit. Therefore, the N channel MOS transistor 723 is turned off, and the output signal of each NOR circuit of the OR array section is set to "1" level (precharge level).

Next, if the Pre/Dis signal is set to a discharge mode ("1" level"), and the N channel MOS transistor 714 for discharge of each NOR circuit of the AND array section 71 is turned on, one NOR circuit in which all input signals are in "0" level outputs an output signal of "1" level, and supplies the outputs signal of "1" level (for example, DEC0) to one word line of the OR array section.

Since at least one input signal of the other NOR circuits of the AND array section 71 is set to "1" level, at least one N channel MOS transistor 712 is turned on. Therefore, the outputs of these residual NOR circuits are set to "0" level, and the outputs of "0" level are supplied to the word line of the OR array section 72.

Moreover, the output signal of the NOR circuit having two N channel MOS transistors 714 for discharge is set to "0" level, and the output of "0" level is supplied to the OR array section 72.

In the OR array section 72, the NOR circuit in which at least one input signal is set to "1" level outputs the output signal of "0" level (for example, Bit0).

The discharge is not performed until the level of the word line is determined by the delay circuit 73, and the N channel MOS transistor 723 for discharge of each NOR circuit is maintained to be off state.

Therefore, since the output signal of the NOR circuit in which all input signals are set to "1" level is maintained to be in "1" level (precharge level), the output signal (for example, Bit1, . . . ) of the bit signal of the NOR circuit is set to "1" level.

The output latch circuit 55 latches the output signal of the OR array section 72 by complementary clock signals PH./ PH, and outputs the signal as an output signal OUt of PLA.

As mentioned above, in the AND array section of the conventional PLA, the number of NAND circuits in which all input signals are set to "1" level or the number of NOR circuits in which all input signals are set to "0" is only one.

However, the input signal IR(m) is inputted to all NAND circuits of the AND array section or all OR circuits thereof. Therefore, all NAND circuits of the AND array section or the MOS transistor of the NOR circuits are driven.

Moreover, since the entire PLA is set to be an active state, the entire array section and the entire OR circuit are precharged/discharged. Particularly, in the PLA having the OR typed AND array section 71, all output signals of the AND array section 71 are set to "1" level (precharge level) at the time of precharging, and the output signals of the residual NOR circuits in which all input signals are set to "0" level, excepting one NOR circuit, are discharged to "0" level.

Therefore, there is a disadvantage in that consumption of electric power of PLA is increased. This disadvantage becomes outstanding as the degree of integration of PLA increases and the capacity per unit area becomes large.

SUMMARY OF THE INVENTION

In consideration of the above-mentioned disadvantage, the present invention has been made, and an object of the present invention is to provide a programmable logic array in which consumption of electric power of PLA can be reduced.

In order to attain the above object, according to the present invention, there is provided a programmable logic array comprising a PLA area having a plurality of banks wherein each of the banks has an array of a discharge typed logic circuit for decoding a micro-code, a command code is inputted to each bank at every cycle for executing a predetermined command, and each bank outputs bank selection data for selecting one of the plurality of banks in a next clock cycle; and a control circuit for selecting one bank for decoding the command code of the next cycle from the plurality of banks based on the bank selection data of each bank in the previous cycle, and for sending a command code to only the selected one bank to perform discharge of a discharge typed logic circuit, thereby stopping operations of other banks. Moreover, each of the banks comprises a latch control section for inputting a command code thereto; an AND array section for receiving an input signal from the latch control section; first OR array section having a plurality of decode output OR circuits to which an output signal of the AND array section is inputted; and second OR array section having at least one bank selection signal output NOR circuit; and the control circuit comprises an output selector for selecting output signals of a bank based on a selection control signal; an output register for latching an output signal of the output selector based on a synch clock signal; a bank selection signal latch circuit for latching a bank selection signal outputted from the output register based on the synch clock signal to be supplied to the output selector as a selector control signal; a precharge signal line for supplying the synch clock signal to each of the bank as a precharge signal; a latch signal supply circuit, provided to each corresponding bank, for decoding the bank selection signal of the output register to be outputted as a latch signal of the latch control section; and a discharge control signal supply circuit, provided to each corresponding bank, for ORing the latch signal and the precharge signal to be supplied to each bank as a discharge signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 5 is a block diagram showing a PLA for a micro-code of the present invention.

DETAILED DESCRIPTION OF THE PREFERRED EMBODIMENT

A PLA of the present invention will be explained with reference to the drawings.

Figure 1:
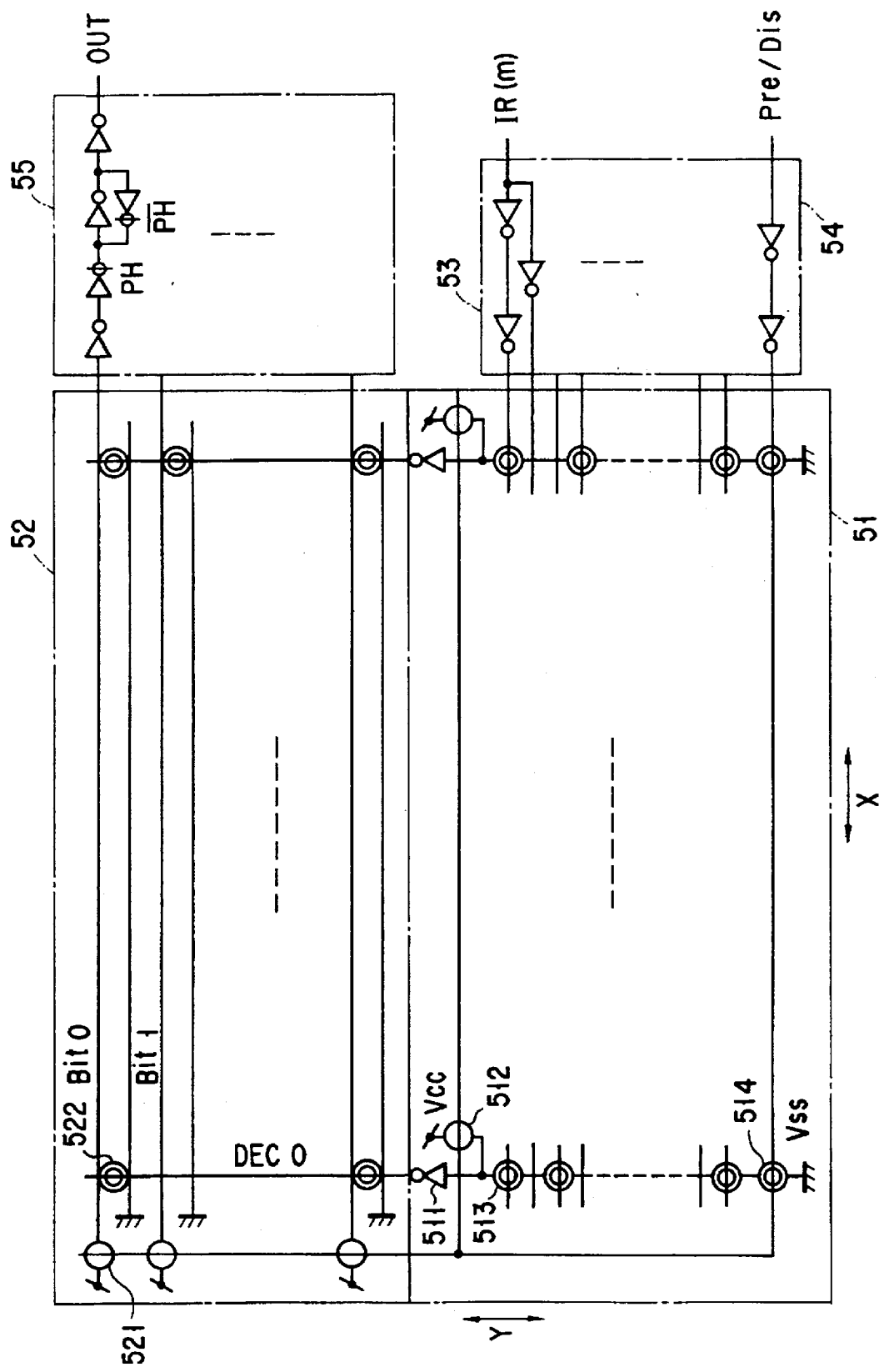
FIG. 1 is a circuit diagram showing one example of a conventional PLA for a micro-code.
Figure 2:
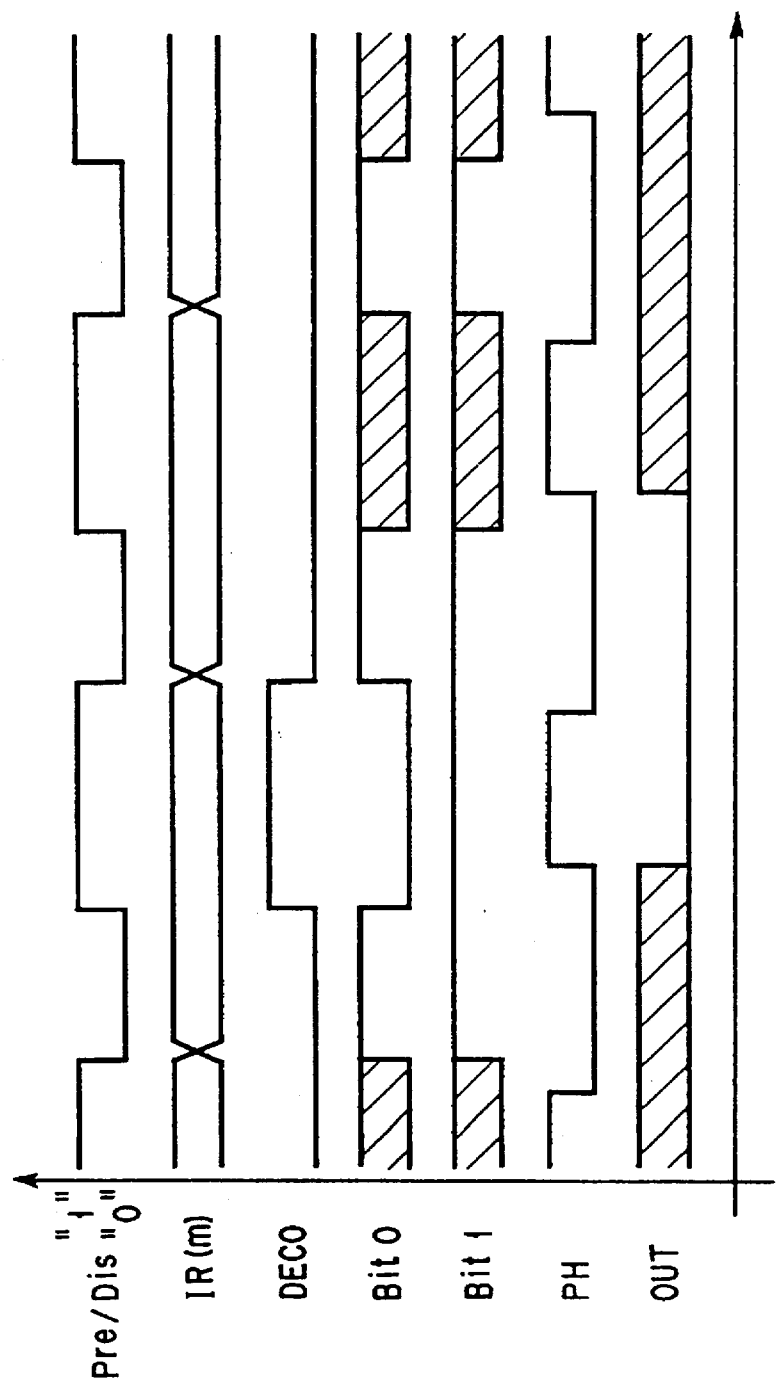
FIG. 2 is a timing chart showing an operation of the PLA of FIG. 1.
Figure 3:
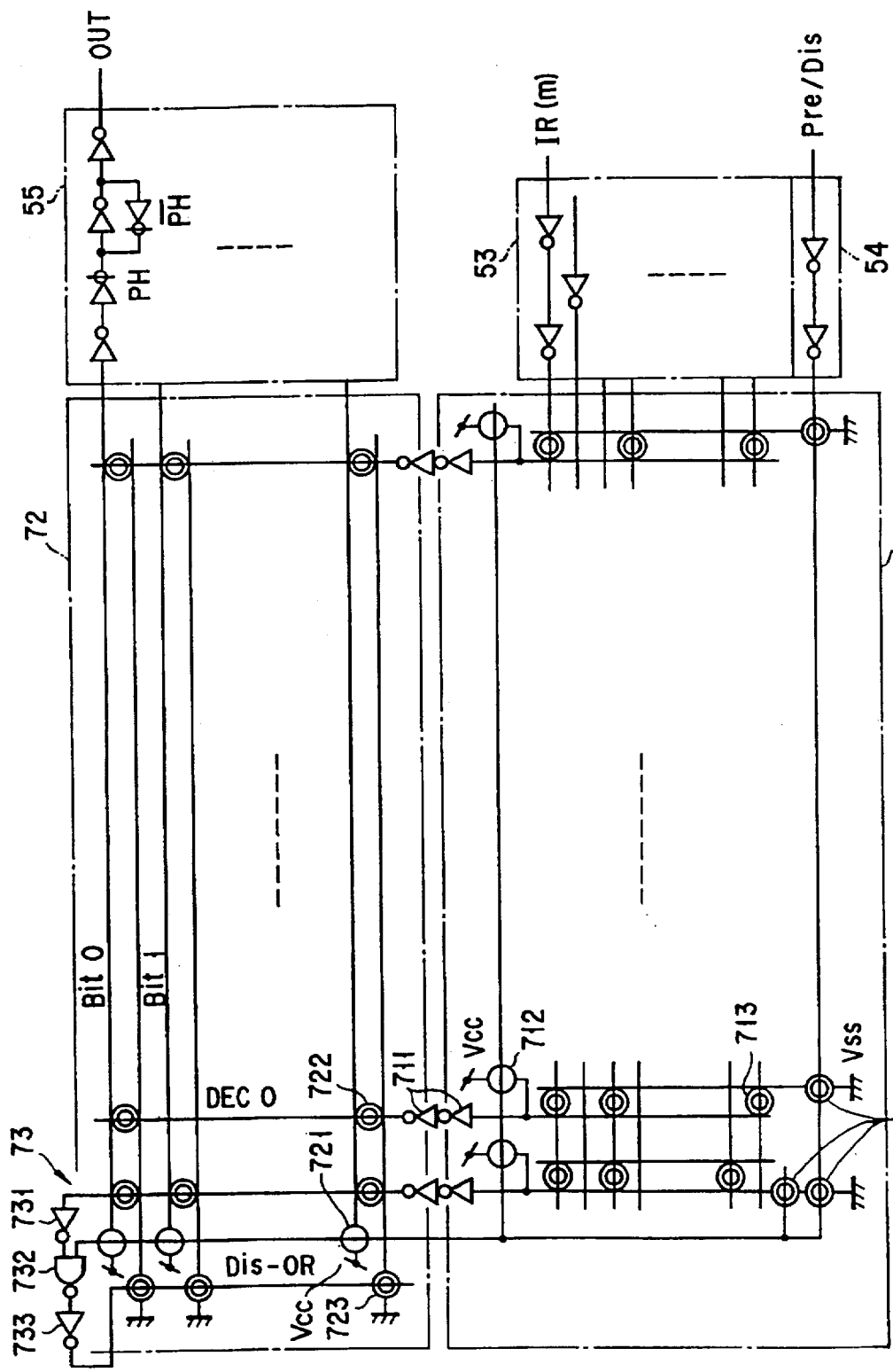
FIG. 3 is a circuit diagram showing the other examples of the conventional PLA for a micro-code.
Figure 4:
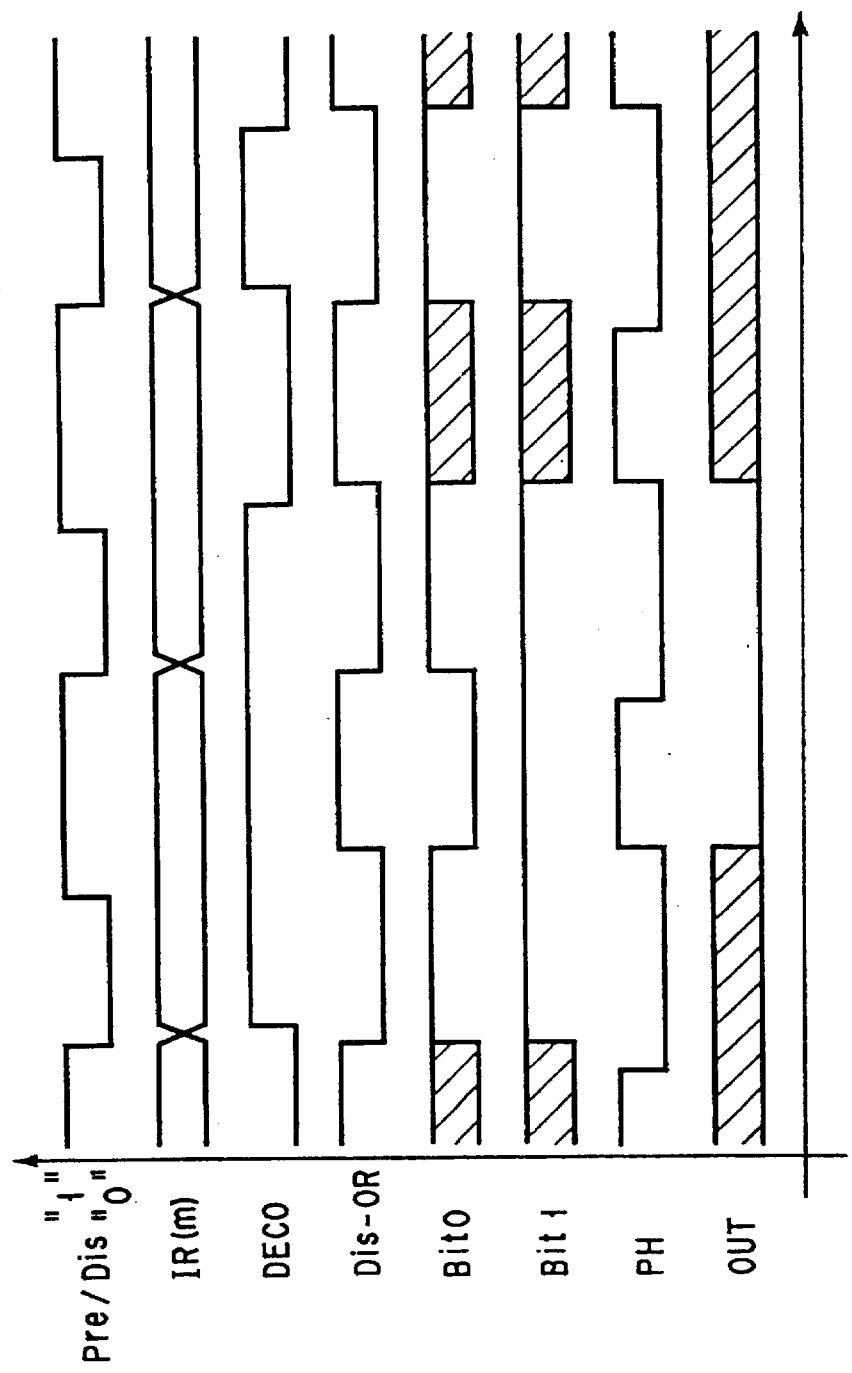
FIG. 4 is a timing chart showing an operation of the PLA of FIG. 3.
Figure 6:
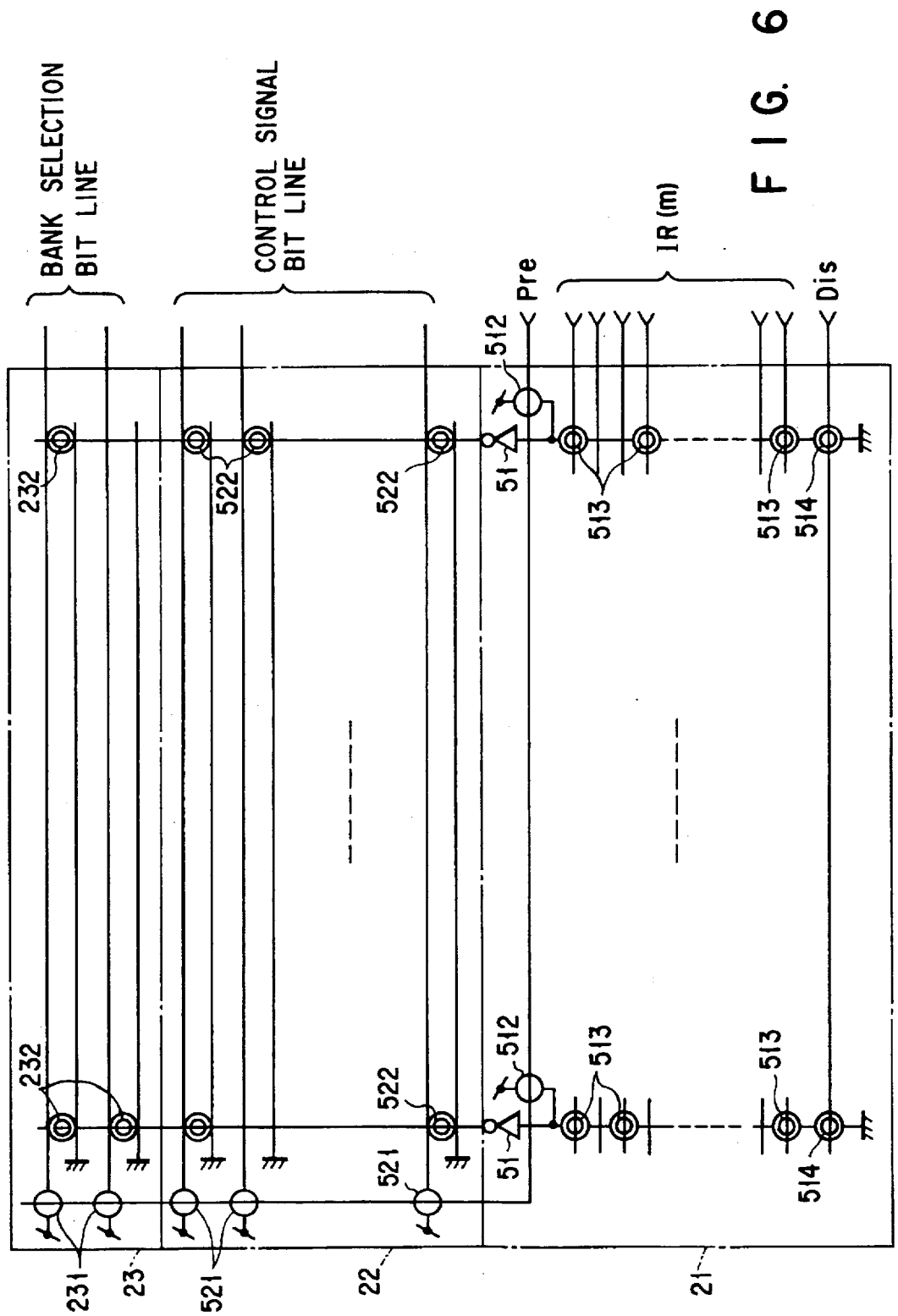
FIG. 6 is a circuit diagram showing a specific example of the PLA of FIG. 5.

FIG. 5 shows a PLA for micro-code of the present invention. FIG. 6 shows a PLA having an AND typed AND array section as a specific example of FIG. 5.

Reference numerals 11 to 14 denote first to fourth banks, respectively. A PLA area comprises the first to fourth banks 14.

Each bank comprises a latch control section 20 to which an address input signal IR<m> is inputted, an AND array section 21 for receiving the address input signal IR<m> from the latch control section 20, an OR array section 22 to which an output signal of the AND array section 21 is inputted, and an OR array section 23 for bank selection control.

Moreover, the OR array section 23 for bank selection control comprises a NOR circuit, and a bit line for outputting the output signal of the NOR circuit. The number of the bit lines is one when the number of the banks is two, the number of the bit lines is two when the number of the banks is four, and the number of the bit lines is three when the number of the banks is eight. In other words, the number of the bit lines depends on the number of banks.

The NOR circuit of the OR array section 23 outputs a bank selection signal for designating which bank in a next clock cycle is decoded.

Reference numeral 24 is an output selector (multiplexer) for selecting an output signal from each bank to be fetched. Reference numeral 25 is an output register (latch circuit), which is provided at the output side of the output selector 24, and inputs a synch clock signal φ to a latch signal input terminal LE.

Reference numeral 26 is a bank selection signal latching circuit for latching two bank selection signals, which are outputted from the output register 25, by the synch clock signal φ. The bank selection signal latching circuit 26 supplies a latch output signal to the output selector 24 as selector control signals BS1A, BS0A.

Reference numerals 271 to 274 are precharge signals lines for inputting the synch clock φ, which is supplied from a clock input buffer circuit (not shown), to each bank as a precharge signal Pre.

Reference numerals 281 to 284 are latch signal buffers, which are provided to correspond to the banks 11 to 14, respectively, for decoding bank selection signals BS1 and BS0 outputted from the output register and supplying the decoded signals to the latch signal LE input terminal of the latch control section 20 of each corresponding bank.

Reference numerals 291 to 294 are discharge control signal buffers, which are provided to correspond to the banks 11 to 14, respectively, for Oring the latch signal LE and the precharge signal Pre, and supplying the discharge signal Dis to each of the banks 11 to 14.

In each bank, the precharge signal Pre is supplied to the AND array section 21, the OR array section 22, and the OR array section 23 for the bank selection control. The discharge signal Dis is supplied to only the AND array section 21.

The AND array section 21 comprises a plurality of NAND circuits arranged in a column direction X, and a plurality of inverter circuits 511, which inverts each of outputs of the plurality of the NAND circuits, and inputs these outputs to the OR array section 22.

Each NAND circuit comprises one P channel MOS transistor 512 for precharge wherein a source is connected to a power supply voltage (Vcc) node, one N channel MOS transistor 514 for discharge wherein a source is connected to a ground voltage (Vss) node, and a plurality of N channel MOS transistors 513 connected in series between a drain of the P channel MOS transistor 512 and a drain of the N channel MOS transistor 514.

The OR array section 22 comprises a plurality of NOR circuits arranged in a row direction Y, a word line extending in a row direction Y, and a decode output wire (bit line) extending in a column direction X.

Each NOR circuit comprises one P channel MOS transistor 521 for precharge wherein a source is connected to a power supply (Vcc) node) and a plurality of N channel MOS transistors 522 wherein a drain is connected to a drain of the P channel MOS transistor 521 and a source is connected to a ground voltage (Vss) node.

The OR array section 23 comprises two NOR circuits for bank selection. Each NOR circuit comprises one P channel MOS transistor 231 for precharge wherein a source is connected to a power supply (Vcc) node and one or more N channel MOS transistors 232 wherein a drain is connected to a drain of the P channel MOS transistor 231 and a source is connected to a ground voltage (Vss) node.

Table 1 shows the relationship between the state of two bank selection signals BS1 and BS0 outputted from the output register circuit 25 of the PLA for microcode and the selected bank.

TABLE 1

| BS0 | BS1 | Bank |
|-----|-----|------|
| 0 | 0 | 0 |
| 0 | 1 | 1 |
| 1 | 0 | 2 |
| 1 | 1 | 3 |

An operation of the PLA for micro-code of the present invention will be explained with reference to FIG. 5.

If the synch clock signal φ is set to "0" level, the PLA is set to the precharge mode, and if the synch clock signal φ is set to "1" level, the PLA is set to the discharge mode.

If the PLA is set to the precharge mode, all banks 11 to 14 are precharged, respectively. Then, a command code of the outer section of the PLA is latched by the latch circuit of one bank, which is selected by two bank selection signals BS1 and BS0 determined by the previous cycle. For example, if two bank selection signals are set to "0", the output signal of the buffer 281 is activated, so that the command code of the outer section of the PLA is latched by the latch circuit 20 of the first bank 11. Then, in the other banks 12 to 14, the latch circuit 20 maintains the command of the previous cycle.

In the selected first bank 11, all input signals of one NAND circuit of the AND array section 21 are set to "1" level by the command code of the cycle this time.

Next, if the PLA is set to the discharge mode, the output signal (discharge control signal) of the discharge control signal buffer 291 is activated. Therefore, in the first bank 11, the output signal of one NAND circuit in which all input signals are set to "1" level becomes "0" level since all N channel MOS transistors are turned on.

The output signal of "1" level (for example, DECO) to the word lines of the OR array sections 22 and 23 is produced by the inverter circuit.

At this time, in the residual NAND circuits of the AND array section 21 of the first bank 11, at least one input signal is in "0" level. Due to this, the output signals of these NAND circuits are maintained to be "1" level (precharge level). Therefore, the output signal of "0" level is supplied to the word lines of the OR array sections 22 and 23 by the inverter circuit.

On the other hand, in the OR array section 22 of the first bank 11, the output signal of the NOR circuit wherein at least one input signal is in "0" level is set to "0" level. For example, the bit line Bit0 of one NOR circuit is set to "0" level.

Moreover, the word line to which the output signal of "1" level is supplied is also supplied to two NOR circuits for bank selection of the OR array section 23. Two bank selection signals BS1 an BS0 are outputted from two bit lines for bank selection signal output, which are connected to the two NOR circuits for bank selection.

In the OR array section 22 of the first bank 11, in order that the output signal of the NOR circuit to which the input signal of "0" level is inputted is maintained to be "1" level (precharge level), the bit line of the NOR circuit (for example, Bit1, . . . ) is maintained to be "1" level.

Then, two bank selection signals, which are determined by the previous cycle, are latched by the bank selection signal latch circuit 26 when the synch clock signal φ is set to "0" level.

The output selector 24 selects the decode output of the first bank 11 by the output signal of the bank selection signal latch circuit 26 (wherein two bank selection signals BS1A and BS0A, which are determined by the previous cycle, are shifted by a half clock of the synch clock signal φ). Next, when the synch clock signal φ is set to "0" level, the output of the output selector 24 is latched by the output register 25, and outputted as a PLA output OUT.

In the second to fourth banks 12 to 14 other than the first bank 11, all output signals of the AND array section are set to "0" level, and all bit lines are maintained to be "1" level.

According to the above-structured PLA, the PLA area is formed of a plurality of banks. Then, in each bank, there is provided bank selection data for determining by which bank the command code of the next cycle is decoded.

Then, bank selection data is outputted every cycle, and a bank for decoding the command of the next cycle is selected. Also, in the next cycle, the fetching of the input signal and the discharging are performed in only the selected bank, and the operations of the other banks is stopped.

Therefore, in the bank, which is not used in the next cycle, the input signal is unchanged, and no discharge is performed. Due to this, the consumption electrical power of the non-used bank is controlled to be substantially zero. Whereby, if the number of the bank divisions is n, the consumption electrical power is controlled to be 1/n as compared with the case that no bank division is performed.

In the above embodiment, the AND typed AND array section was used, but the OR typed AND array section may be used. In this case, in the selected bank, the NOR circuit in which all inputs signal are set to "0" maintains "1" level (precharge level), and the other NOR circuits perform the discharge, and outputs "0" level.

Moreover, the AND array section of each bank and the OR array section, no precharge is performed if it is needed. Also, the output selector may be provided on the bank so as to make the chip size of the integrated circuit smaller.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A programmable logic array comprising:
 a programmable logic array area having a plurality of banks wherein each of said banks has an array of discharge-type logic circuits for decoding a micro-code, executing a predetermined command, and outputting bank selection signals every clock cycle for selecting one of the plurality of banks for executing a predetermined command in a next clock cycle; and
 a control circuit for selecting, based on said bank selection signals outputted from said plurality of banks, one of the plurality of banks for executing the predetermined command in a next clock cycle, wherein said control circuit decodes the bank selection signals output from said plurality of banks, latches the decoded selection signals into only one selected bank, and sends a discharge signal to the one selected bank to discharge the logic circuit thereof, thereby stopping operations of other banks.

2. A programmable logic array comprising:
 a PLA area having a plurality of banks wherein each of said banks has an array of discharge-type logic circuits for decoding a micro-code, executing a predetermined command, and outputting bank selection signals every clock cycle for selecting one of the plurality of banks for executing a predetermined command in a next clock cycle; and
 a control circuit for selecting one of the plurality of banks for executing the predetermined command in a next clock cycle, wherein said control circuit decodes the bank selection signals output from said plurality of banks and sends a discharge signal to the selected one bank to discharge the logic circuit thereof, thereby stopping operations of other banks;
 wherein each of said banks comprises:
   a latch control section for latching a command code thereto based on a latch control signal;
   an AND array section, having a plurality of AND circuits, for receiving an input signal from said latch control section;
   a first OR array section having a plurality of decode output OR circuits, to which output signals of the AND circuits of said AND array section are inputted, for providing a decode output of the signals outputted from the AND circuits of the AND array section; and a second OR array section having at least one bank selection signal output OR circuit to which the output signals of the AND circuits of said AND array section are inputted, for providing at least one bank selection signal indicating a bank by which a command code in a next execution cycle is decoded; and wherein said control circuit comprises:

an output selector for receiving output signals of the first OR array section and the second OR array section of the banks and selecting output signals of the first OR array section and the second OR array section of a bank based on a selector control signal;

an output register for latching the output signals of the first OR array section and the second OR array section of the bank selected by said output selector based on a synch clock signal;

a bank selection signal latch circuit for latching the output signal of the second OR array section of the bank from said output register based on the synch clock signal and for producing said selector control signal;

a precharge signal line for supplying said synch clock signal to each of said banks as a precharge signal;

a latch signal supply circuit, provided to a corresponding bank, for receiving and decoding the bank selection signal of said output register and supplying the decoded bank selection signal to the latch control section of the corresponding bank as a latch control signal; and a discharge control signal supply circuit, provided to a corresponding bank, for ORing said latch control signal and said precharge signal and supplying the ORed signal to the AND array section of the corresponding bank as a discharge signal.

3. A programmable logic array comprising:

a programmable logic array area having a plurality of banks for receiving instruction code inputs to said plurality of banks every instruction-execution cycle and for outputting bank selection information every instruction-execution cycle, wherein each of said banks has an array of discharge-type logic circuits for decoding a micro-code and has bank selection information for designating in which bank an instruction in a next instruction-execution cycle is to be decoded; and a control circuit for selecting one of said plurality of banks in which an instruction in a next instruction-execution cycle is to be decoded, based on said bank selection information outputted from said plurality of banks, and for controlling said plurality of banks so that, in the next instruction-execution cycle, the instruction is latched only into a selected bank, the discharge-type logic circuit of the selected bank is discharged, and those of said plurality of banks that are not selected are stopped.

* * * * *